United States Patent
Connor et al.

(10) Patent No.: US 6,617,986 B2
(45) Date of Patent: Sep. 9, 2003

(54) AREA EFFICIENT, SEQUENTIAL GRAY CODE TO THERMOMETER CODE DECODER

(75) Inventors: John Connor, Burlington, VT (US); Patrick R. Hansen, Essex Junction, VT (US); Steven Leschuk, Little Silver, NJ (US); Jason E. Rotella, Minesville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/682,449

(22) Filed: Sep. 4, 2001

(65) Prior Publication Data

US 2003/0071747 A1 Apr. 17, 2003

(51) Int. Cl.[7] .............................. H03M 7/04; H03M 7/16
(52) U.S. Cl. ........................ 341/97; 341/159; 341/160; 341/64
(58) Field of Search .......................... 341/97, 98, 159, 341/160, 64

(56) References Cited

U.S. PATENT DOCUMENTS

| | | | |
|---|---|---|---|
| 3,277,380 A | | 10/1966 | Paufve |
| 3,295,063 A | | 12/1966 | Felcheck et al. |
| 4,509,183 A | | 4/1985 | Wright |
| 4,733,220 A | * | 3/1988 | Knierim ........................ 341/64 |
| 5,382,955 A | * | 1/1995 | Knierim ........................ 341/64 |
| 5,459,466 A | * | 10/1995 | Knierim et al. ............. 341/160 |
| 5,633,636 A | | 5/1997 | Reyhani |
| 5,734,342 A | * | 3/1998 | Mes ............................ 341/159 |
| 6,100,740 A | | 8/2000 | Pascucci |
| 6,268,816 B1 | | 7/2001 | Bult et al. |
| 6,269,138 B1 | | 7/2001 | Hansson |
| 6,388,602 B1 | * | 5/2002 | Yang ........................... 341/159 |

OTHER PUBLICATIONS

Dally et al., Digital Systems Engineering, 1998, Cambridge University Press pp. 519–521.
Wuorinen, John H., Dynamic Termination Output Driver for a 600MHz Microprocessor, Feb. 2000, vol. 43, IEEE Catalog No. OOCH37056, 4 pages.
Digital to Analog Converters, The City College of the City University of New York, Spring 2001 class notes, Department of Electrical Engineering, EE 457, 10 pages.
Vesterbacka et al., A Research Project Within the Integrated Analog and Digital Systems Group, Electronics Systems Research and Development projects, Department of Electrical Engineering, (Swedish), 6 pages.

* cited by examiner

Primary Examiner—Brian Young
Assistant Examiner—John Nguyen
(74) Attorney, Agent, or Firm—Schmeiser, Olsen & Watts; Richard A. Henkler

(57) ABSTRACT

A Sequential Gray Code to Thermometer Code decoder circuit adapted for area efficient use at each pad of an integrated circuit chip for incrementally adjusting a digitally adjustable resistance for continuous or periodic adjustment of on-chip terminations. The sequential decoder for decoding a Gray code count to a T-bit Thermometer code count is constructed of a plurality (T) of cascaded decoder cells, each cell sensing the state of only one bit of the Gray code count. The decoder cells are cascaded to from decoding-latching stages each stage responsive to an individual one of single-bit changes between consecutive counts in the Gray code. Each stage contains a decoding-latching circuit adapted to detecting and latching the occurrence of one single-bit change in the Gray code.

18 Claims, 13 Drawing Sheets

CHIP WITH PLURALITY OF DECODER-CONTROLLED ADJUSTABLE RESISTOR TERMINATIONS.

WAVEFORMS OF INPUTS ABCD AND OUTPUTS 1-15

COMBINATIONAL DECODER

CELL 1 OF THE COMBINATIONAL LOGIC DECODER. DEVICE COUNT OF 8.

CELL 3 OF THE COMBINATIONAL LOGIC DECODER. DEVICE COUNT OF 10.

CELL 13 OF THE COMBINATIONAL LOGIC DECODER. DEVICE COUNT OF 12.

DEVICE COUNT OF AREA EFFICIENT, SEQUENTIAL DECODER VERSUS COMBINATIONAL LOGIC

BLOCK DIAGRAM OF AESD

CIRCUIT DIAGRAM OF AESD

TIMING OF AESD INCREMENTING, THEN DECREMENTING

ACTIVE LOW CELL

ACTIVE HIGH CELL

EXAMPLE OF TERMINATION CIRCUITRY DRIVEN BY AREA EFFICIENT, SEQUENTIAL DECODER

AREA EFFICIENT, SEQUENTIAL GRAY CODE TO THERMOMETER CODE DECODER

BACKGROUND OF THE INVENTION

1. Technical Field

The invention relates generally to digital to analogue converters (DAC), and more specifically, to the design of a Gray Code to Thermometer Code decoder circuit for incrementally adjusting a digitally adjustable resistance for continuous or periodic adjustment of on-chip terminations.

2. Related Art

High performance SRAMs produced in conformity with the DDR3 specification are required to incorporate on-chip programmable termination at all input pads. The value of digitally adjustable termination resistors are typically programmed to match a multiple of the line impedance, $Z_0$, to improve signal integrity in the interface between two chips. Digitally adjustable resistors are digital-to-analog converters (DACs).

Programable Termination Circuitry

A programmable terminator circuit can be constructed from binary weighted devices presenting a tunable impedance at each chip pad. For instance, a 4 bit binary weighted termination circuit has 4 devices of widths 1×, 2×, 4×, 8×, for a total width of 15×. The gate inputs to theses devices are driven by the latched outputs of a 4 bit binary code counter. This design has the disadvantage of possibly changing multiple bits as the count is incremented or decremented by one. For example, if the 4-bit count is incremented from 7 to 8, the binary count changes from 0111 to 1000; all four bits change. If timing skews or noise is present, it is possible to see a count of 0000 (max. impedance), or 1111 (min. impedance), or various other combinations while the bits are changing from 7 to 8. If the skew/noise is moderate, these transient counts appear as impedance glitches on the interface which can reduce signal integrity. If the skew/noise is more severe, it is possible to get an 'impartial count update' if the incorrect state of any bit is latched into downstream registers.

Using Gray code counting (in conjunction with Unary/Thermometer code decoding—discussed below) avoids the problem discussed above of simultaneously changing multiple bits since only one bit changes as the count is incremented or decremented by one. For instance, changing the count from 7 to 8, results in the equivalent Gray code count changing from 0100 to 1100; only one bit (the MSB) changes. Even if severe skew/noise is present, the contents of downstream latches will either remain 0100 or get updated to 1100.

Equally weighted termination devices can be used in place of binary weighted device sizes. An equally weighted termination circuit has 15 devices of 1× width and a total width of 15×. The equally weighted termination circuit however requires that the 4 bit Gray code count be decoded into a 15-bit unary code count (e.g., a redundant Thermometer code wherein, e.g., 10010101101101 equals 001110101101010). A thermometer-coded scheme can be improved by using resistive device-shape factors that produce incremental changes in conductance that are a fixed percentage of accumulated conductance. This idea leads to a slowly tapering set of sizes in the resistor elements. See generally, Digital Systems Engineering, Dally (Cambridge U. Press 1999) section 11.1.3.2.

Table 1 is a logic table illustrating how a 4-Bit Gray code to 15-Bit Thermometer code Decoder would operate in logical theory, wherein all Thermometer code outputs 1–15 are active-high (i.e., a High voltage indicated symbolically by a "1" characterizes the "active" state of the active-high output).

TABLE 1

4-Bit Gray code to 15-Bit Thermometer Code Example

| Decimal Count | Gray Code DCBA | Thermometer Code 111111000000000 543210987654321 |
|---|---|---|
| 0 | 0000 | 000000000000000 |
| 1 | 0001 | 000000000000001 |
| 2 | 0011 | 000000000000011 |
| 3 | 0010 | 000000000000111 |
| 4 | 0110 | 000000000001111 |
| 5 | 0111 | 000000000011111 |
| 6 | 0101 | 000000000111111 |
| 7 | 0100 | 000000001111111 |
| 8 | 1100 | 000000011111111 |
| 9 | 1101 | 000000111111111 |
| 10 | 1111 | 000001111111111 |
| 11 | 1110 | 000011111111111 |
| 12 | 1010 | 000111111111111 |
| 13 | 1011 | 001111111111111 |
| 14 | 1001 | 011111111111111 |
| 15 | 1000 | 111111111111111 |

FIG. 2 illustrates the manner in which a real 4-Bit Gray code to 15-Bit Thermometer code Decoder would operate in real time while monotonically incrementing from Thermometer code count 0 to count 15. The Gray code count is sequentially incremented from count zero to count 15 via bits A, B, C, & D which results in the Thermometer code count incrementing from count zero to count 15 via bits 1–15.

An advantage of the Gray code to Thermometer code system is that the magnitude of any potential impedance glitch is further reduced, since when the impedance count is updated (e.g., incremented or decremented by a single unit), a single device of width=1× is either enabled (counting up) or disabled (counting down). This corresponds to a relatively small change in the total value of the termination impedance and produces a smaller glitch on the interface than that produced when multiple devices are switched (as may occur in a binary weighted system). Also, the potential for a relatively large change in terminator impedance due to an "impartial count update" is eliminated.

FIG. 3 depicts a topology of a simple Combinational Logic Decoder 100 that utilizes Combinational logic circuits to convert Gray code into Thermometer code (FIG. 3). This topology includes one cell per output bit, each cell being adapted to be activated by a particular count of the gray code or any higher count. For example, 15 cells would correspond to the 15 output bits of Thermometer code, and upon the occurrence of count 15, all 15 cells would be active. Each cell contains different Combinational logic circuitry (e.g., a different selection or arrangement of Combinational logic gates) corresponding to the specific input/output relationship of each cell. The output of each cell depends solely on the Gray coded inputs and is independent of the outputs of other cells. To output the desired Thermometer code, the corresponding Gray code is inputted without any reset. To set the Thermometer code to a different value, the new Gray code is inputted without any reset command. The Combinational cells have no memory or feedback mechanisms. The past output values have no bearing on current output values. Thus, if the Gray code input value changes by more than one (e.g., from a Gray coded 1 to a Gray coded 4,) the Thermometer code output will change by more than one (e.g., by 3).

FIGS. 4, 5 and 6 each show the combinational (i.e., combinatorial) logic within one the cells depicted in FIG. 3. The output of these cells directly corresponds to the above Thermometer code in Table 1.

FIG. 4 depicts exemplary combinational logic gates within CELL1 of the simple Combinational Logic Decoder 100 of FIG. 3. CELL1 can be implemented with a NAND gate (1NAND) composed of 8 CMOS (Complementary Metal Oxide Semiconductor) transistors (i.e, the device count in CELL1 is 8).

FIG. 5 depicts exemplary combinational logic gates within CELL3 of the simple Combinational Logic Decoder 100 of FIG. 3. CELL3 can be implemented with two (cascaded) NAND gates (3NAND1 and 3NAND2) composed of 10 CMOS transistors (i.e, the device count in CELL3 is 10).

FIG. 6 depicts exemplary combinational logic gates within CELL13 of the simple Combinational Logic Decoder 100 of FIG. 3. CELL13 can be implemented with three (cascaded) gates (13NAND1, 13NOR1, 13NOR2) composed of 12 CMOS transistors.

BRIEF SUMMARY OF THE INVENTION

The disclosed Area Efficient Sequential Decoder (AESD) topology (illustrated by the exemplary 4-Gray-code-bit decoder 200 in FIG. 8a) overcomes the limitations of a combinational logic decoder (e.g., decoder 100 of FIG. 3) for decoding a gray coded count into a unary coded count (e.g., thermometer coded count). The disclosed AESD topology (see FIG. 8a) provides a lower device count when compared to the simple combinational logic solution 100. For example, for a 4 Gray code bit to 15 Thermometer code bit decoder, the AESD topology (200) uses only 90 (or fewer, see optimization methods discussed below) devices. The simple Combinational logic solution (See FIGS. 3, 4, 5, and 6) uses a practical minimum of 124 devices. As the number of Gray coded bits to be decoded increases (i.e., as the order N of the decoder increases), the AESD topology continues to outperform the simple Combinational logic solution in device count. Although the exemplary AESD decoder 200 decodes a 4-bit Gray coded word, the AESD topology is Area Efficient for and capable of decoding sequences of N-bit Gray code words, where N is any integer number equal to or greater than 1. A single AESD decoder may be employed to control a plurality of termination devices (e.g., wired in parallel).

FIG. 7 shows the relationship between the number of Gray coded bits to be decoded, and the numbers of devices needed for decoding Gray code into Thermometer code using the topology of Combinational logic decoder 100 (of FIG. 3) and the disclosed topology of a sequential decoder (e.g., decoder 200 of FIG. 8a).

The minimization of devices needed to implement a Gray code to Thermometer code decoder allows the AESD topology decoder to be area efficient. Each cell of the decoder and an entire AESD decoder 200 may be implemented as an integrated circuit on a chip (e.g., chip 10 shown in FIG. 1). One or more copies of the AESD decoder may be provided to each signal line pad on the chip to control termination at each pad. (E.g., two decoders 200 may be used at each of K (clock, address, data and control) pads of an integrated circuit chip 10, e.g., for implementing each of 2K decoders on the chip 10 of FIG. 1). Thus, the area efficiency of the AESD decoder becomes more significant as the number of pads to be terminated increases.

Another feature of the AESD topology is that no more than two unique decoder cell topologies (see, e.g., FIGS. 9 and 10) are needed to implement the area efficient decoder. (In an alternative embodiment of the invention depicted in FIG. 12, a single self-cascading cell topology is used to implement all the cells of a sequential decoder, each self-cascading cell having an increased device-count).

A feature that further distinguishes the Sequential (AESD) Decoder 200 from the Combinational decoder 100 is that the operation of the AESD decoder relies upon sequential counting (up or down in order) of the inputted Gray code count, and thus provides incremental changes in the Thermometer coded output. In other words, the Thermometer coded count that is asserted by the decoder will be incremented or decremented one count at a time. This feature supports fixed percentage increases of accumulated conductance, and helps to avoid noise which can arise from rapid multi-count changes of the programmed termination impedance values.

Accordingly, a first aspect of the invention provides a circuit for decoding an N-bit (e.g., 4-bit) gray coded count into a count of a unary code (e.g., Thermometer code), comprising: a first cell having a first input and a first output; a second cell having a second input and a second output; a third cell having a third input and a third output, wherein the first output is gated by feedback from the second output, the second output is gated by feedforward from the first output and by feedback from the third output, and the third outputted is gated by feedforward from the second output, wherein the first, second and third inputs are each selected from gray code bits of the gray coded count and the logical complements of said gray code bits, and wherein the first, second and third outputs are each a different bit of the unary coded count or the logical complement of such a bit.

A second aspect of the invention provides an apparatus for decoding a consecutive sequence of N-bit Gray coded words, comprising: a sequential Gray code to Thermometer code decoder.

A third aspect of the invention provides a Gray code decoder comprising: a plurality of cascaded decoding-latching stages, each decoding-latching stage responsive to an individual one of single-bit changes between consecutive counts in a Gray code, each decoding-latching stage adapted to detecting and latching the occurrence of one such single-bit change, each decoding and latching stage having a decoding-latching circuit. In some embodiments, decoding-latching circuits having inverted outputs which can be serially alternating with decoding-latching circuits having noninverted outputs.

A fourth aspect of the invention provides a circuit for decoding counts of an N-bit gray code to up to $2^N-1$ Thermometer coded bits, comprising: a plurality (u) of cells, each cell being adapted to output a single bit of the Thermometer coded bits, wherein an output of each of the u cells is influenced by an operative connection from an output of any next cell and is further influenced by an operative connection from an output of any prior cell.

A fifth aspect of the invention provides an apparatus for converting gray code to thermometer code, the apparatus comprising: a plurality of modules, each module receiving one bit of the gray code and outputting a bit of the thermometer code, each module being coupled serially to another module.

A sixth aspect of the invention provides a method for decoding a consecutive sequence of N-bit Gray coded words, comprising: sequentially decoding Gray code to Thermometer code.

A seventh aspect of the invention provides a method of Gray code decoding, comprising: providing a plurality of cascaded decoding-latching stages, each decoding-latching stage responsive to an individual one of single-bit changes between consecutive counts in a Gray code, each decoding and latching stage having a decoding-latching circuit; and detecting and latching, by each decoding-latching stage, the occurrence of each such single-bit change.

A eighth aspect of the invention provides a method for decoding counts of an N-bit gray code to up to u Thermometer coded bits, comprising: providing a plurality (u) of cells, wherein u is an integer equal to or less than $2^N-1$; and outputting by each cell a single bit of the Thermometer coded bits, wherein the outputting by each said cell is influenced by an operative connection from an output of any next cell and is further influenced by an operative connection from an output of any prior cell.

A ninth aspect of the invention provides a method for converting gray code to thermometer code, the method comprising: providing a plurality of modules; coupling each module serially to another module; receiving by each module one bit of the gray code; and outputting by each module a bit of the thermometer code.

BRIEF DESCRIPTION OF THE SEVERAL VIEWS OF THE DRAWINGS

The features of the invention are set forth in the appended claims. The invention itself, however, will be best understood by reference to the following detailed description of illustrative embodiments when read in conjunction with the accompanying drawings, wherein:

FIG. 8b is a functional block diagram depicting the function of decoding and latching circuits within cascaded cells and stages of the AESD decoder of FIG. 8a;

FIG. 8c is a timing diagram depicting waveforms of gray coded inputs and thermometer coded outputs of the sequential decoder of FIG. 8a;

FIG. 9 is a schematic diagram of a generic active-low cell within the decoder of FIG. 8a;

FIG. 10 is a schematic diagram of a generic active-high cell within the decoder of FIG. 8a;

FIG. 11 is a schematic diagram depicting an example of a pulldown termination circuit that may be driven by the outputs of the decoder 200 depicted in FIG. 8a;

DETAILED DESCRIPTION OF THE INVENTION

Figure 8A:
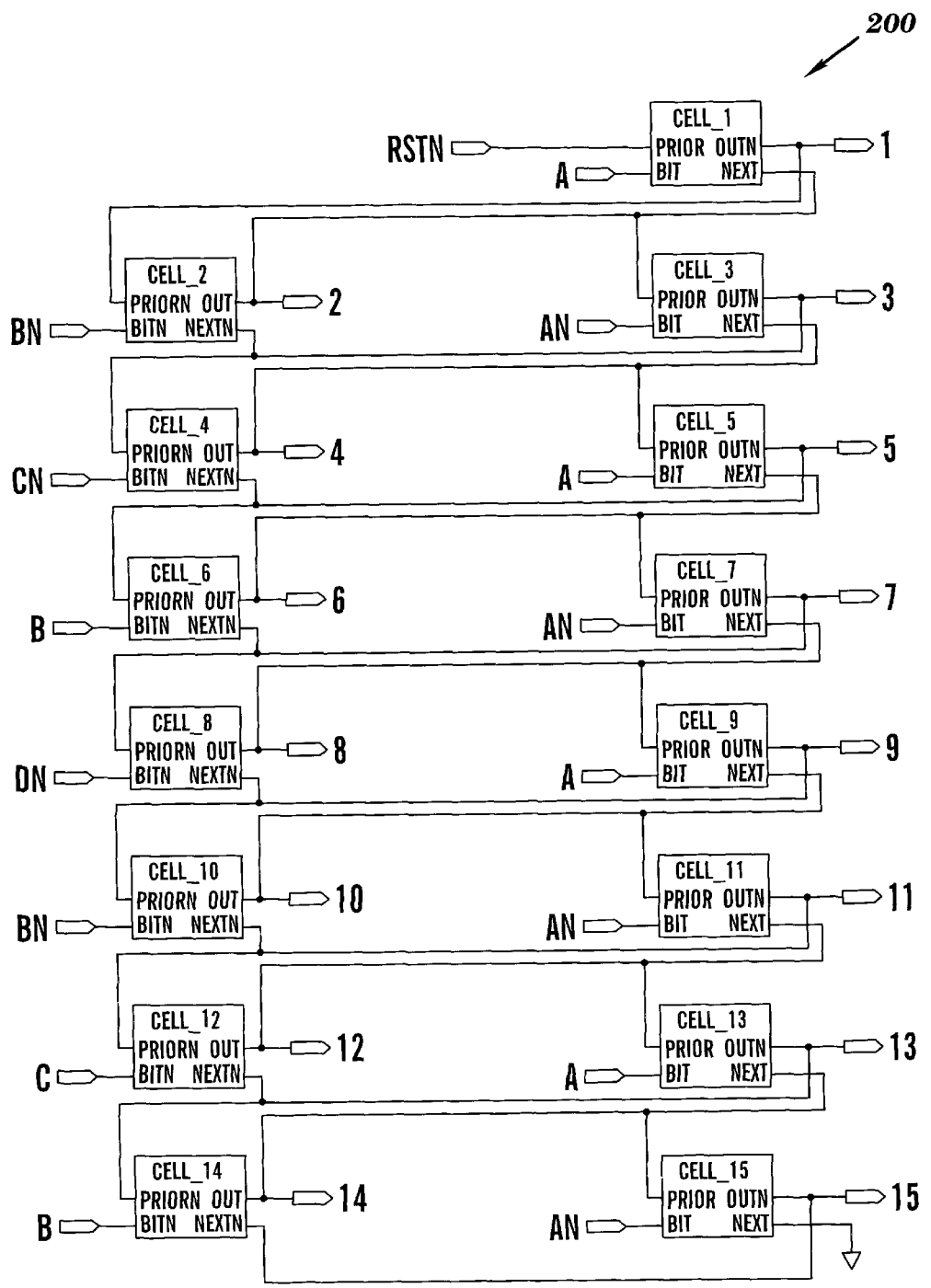
FIG. 8a depicts a high level block diagram of a 4 Bit Gray code to 15 Bit Thermometer code implementation of the Area Efficient Sequential Decoder (AESD) 200 constructed in accordance with embodiments of the invention.

FIG. 8a depicts a high level block diagram of a 4-bit Gray code to 15-bit Thermometer code implementation of the Area Efficient Sequential Decoder (AESD) 200 constructed in accordance with embodiments of the invention. Each cell (e.g., CELL_1) of the decoder 200 outputs one bit of thermometer code. The first cell (CELL_1) outputs the first bit of thermometer code; the second cell (CELL_2) outputs the second bit of thermometer code, and so forth for all 15 cells.

The odd number cells are active-low cells while the even numbered cells are active-high cells. (This orientation can be reversed in alternative embodiments, with an accompanying complementing of each BIT(N) input signal and the RSTN signal) FIG. 8a does not depict termination circuitry or other circuitry that can be driven by outputs of CELL_s 1–15 (see e.g., FIG. 11). A cell is "active" when its output (e.g., OUT or OUTN, collectively OUT(N)) is in the opposite state than it was placed in by initialization (or by Gray code count zero). Each cell outputs one Thermometer code bit. Accordingly, all cells are "inactive" at Gray code count zero, or upon initialization. In the case of AESD decoders formed of a series of alternating active-low and active-high cells, at initialization and at Gray code count zero, the voltage output of the active-low cells will be a logic high voltage level (i.e., "1") (inactive state), and the voltage output of the active-high cells will be a logic low voltage level (i.e., "0") (inactive state).

Figure 1:
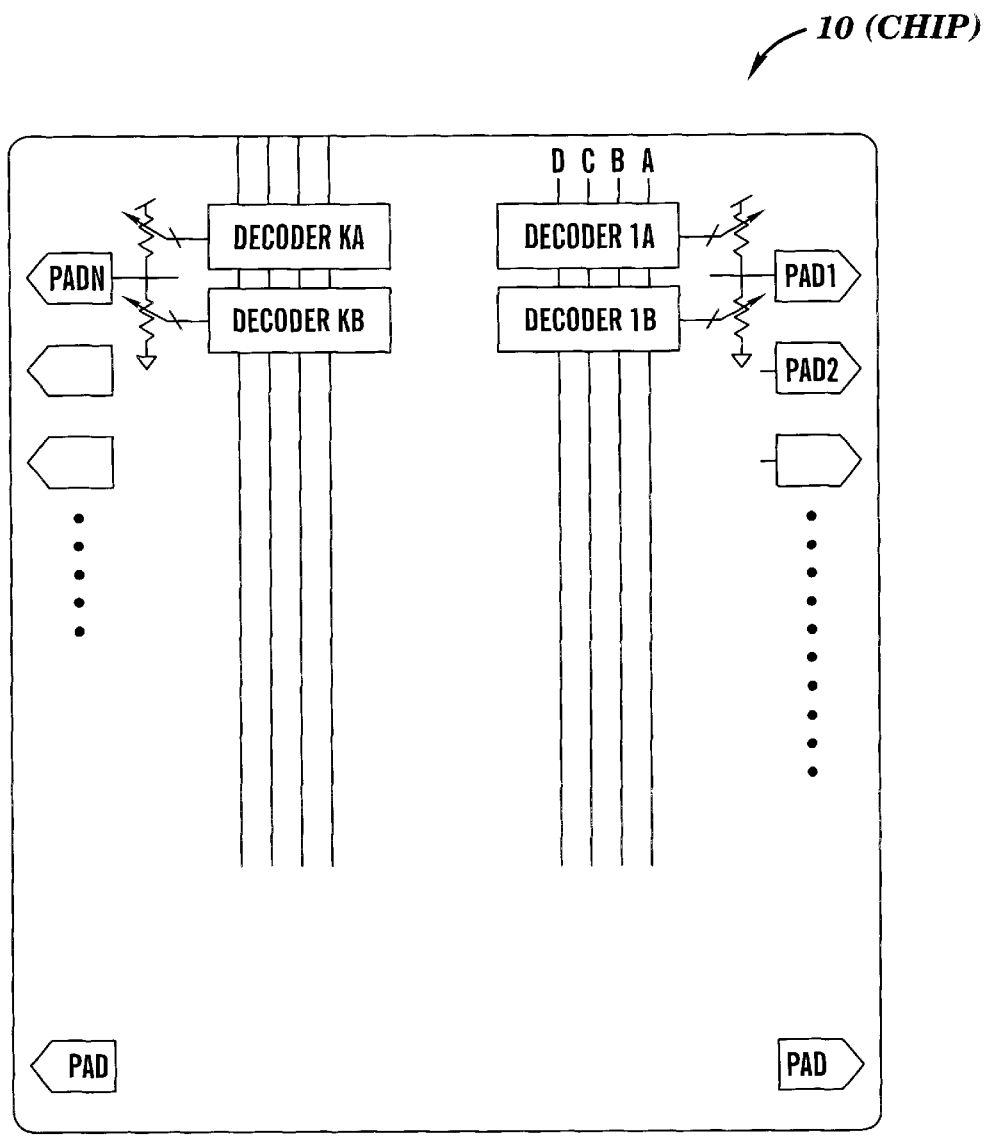
FIG. 1 is a diagram depicting an integrated circuit chip including a plurality of I/O pads having decoder-controlled adjustable-resistor terminations.
Figure 2:
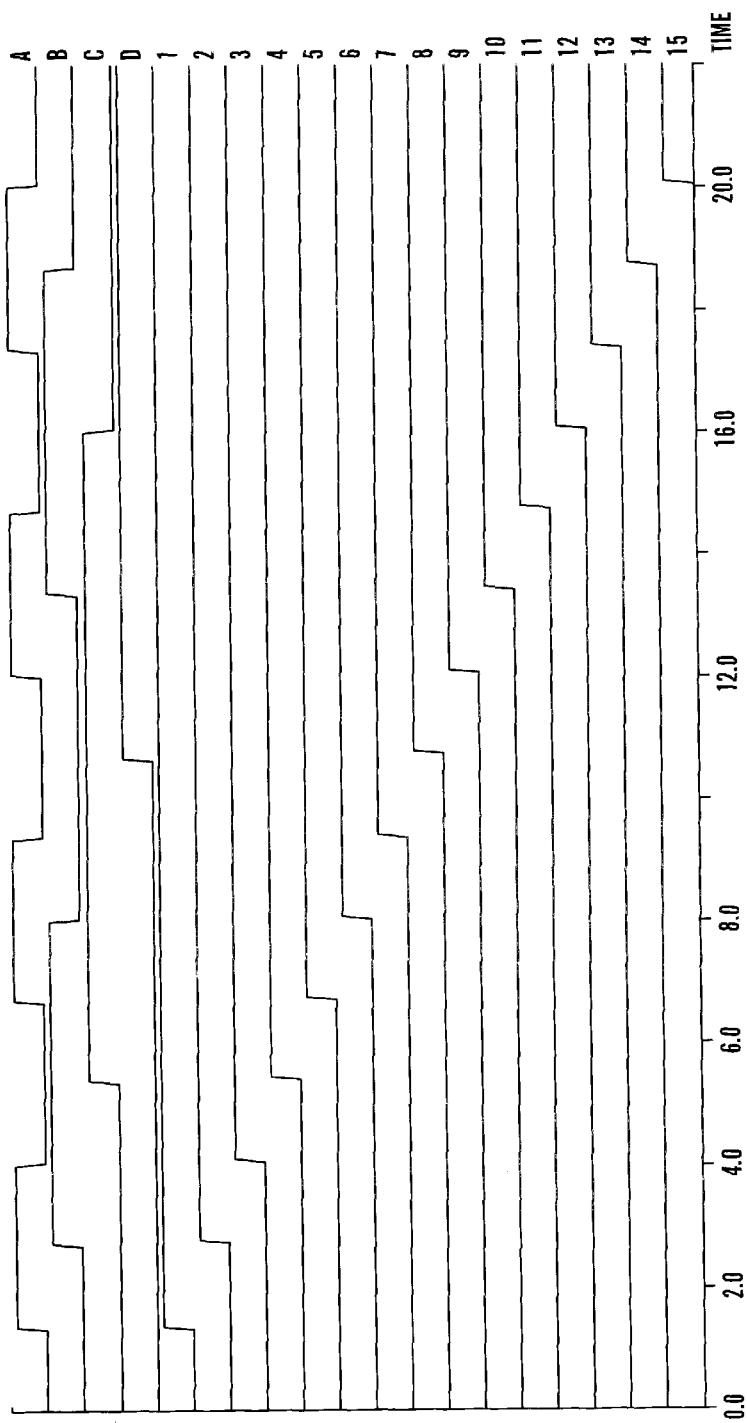
FIG. 2 is a timing diagram depicting waveforms of gray coded inputs and thermometer coded outputs of a decoder of the related art.
Figure 3:
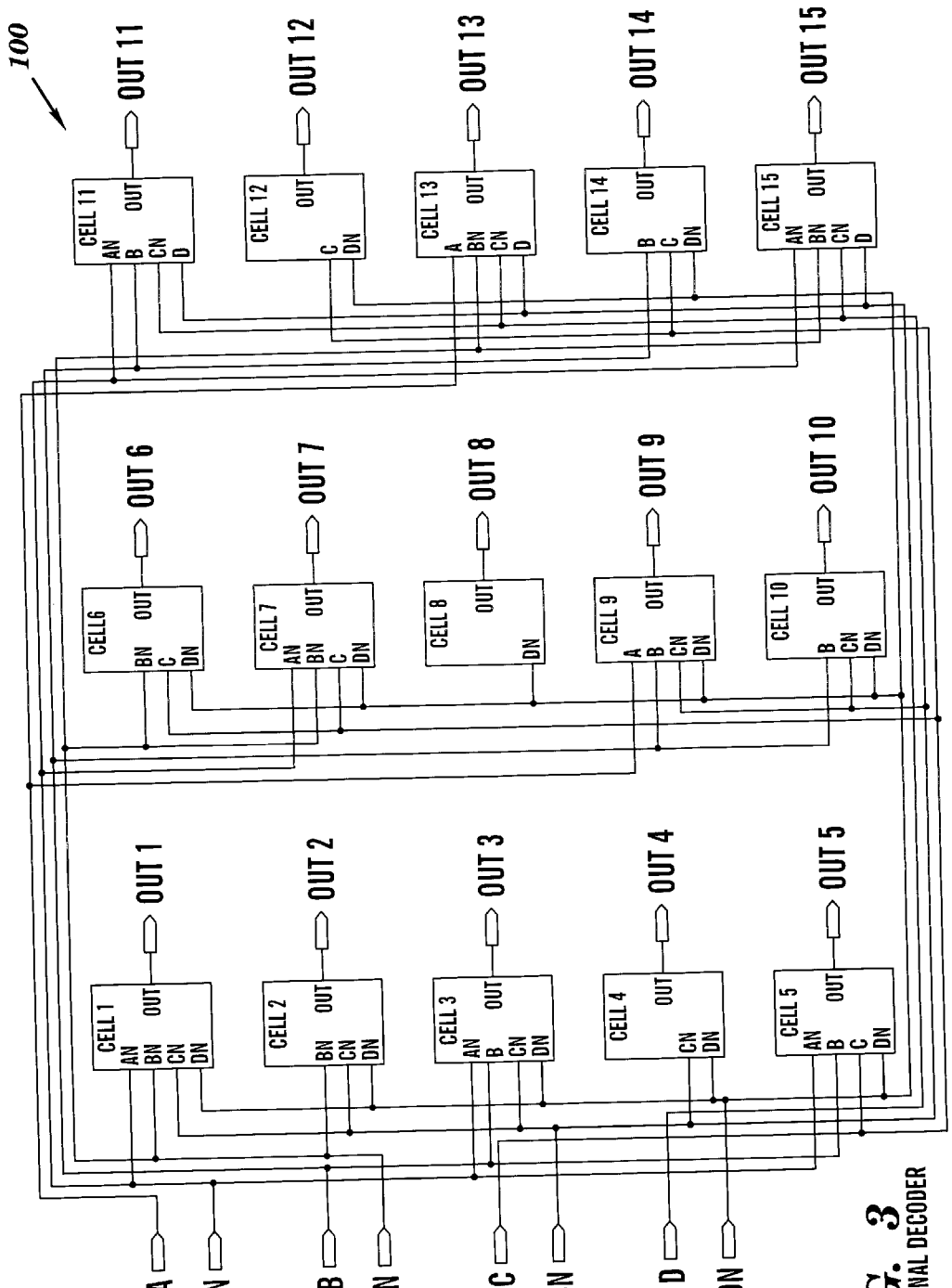
FIG. 3 is a high level block diagram of a Combinational decoder of the related art for decoding 4 Bit Gray code to 15 Bit Thermometer code.
Figure 4:
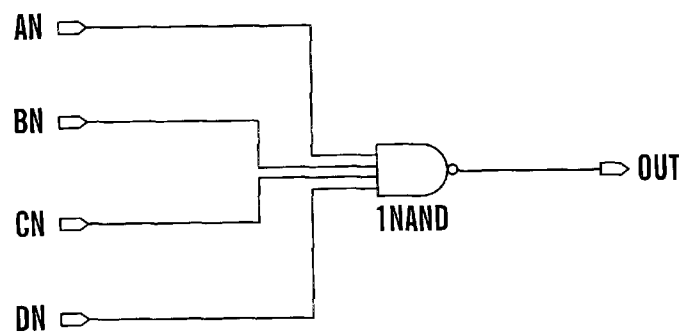
FIG. 4 is a block diagram of the combinational logic within cell 1 of the decoder of FIG. 3.
Figure 5:
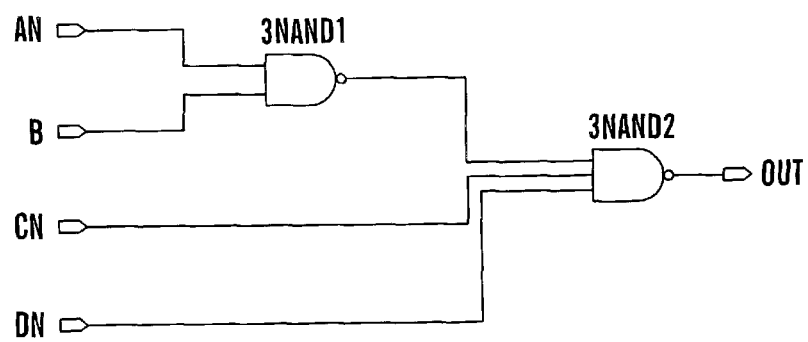
FIG. 5 is a block diagram of the combinational logic within cell 3 of the decoder of FIG. 3.
Figure 6:
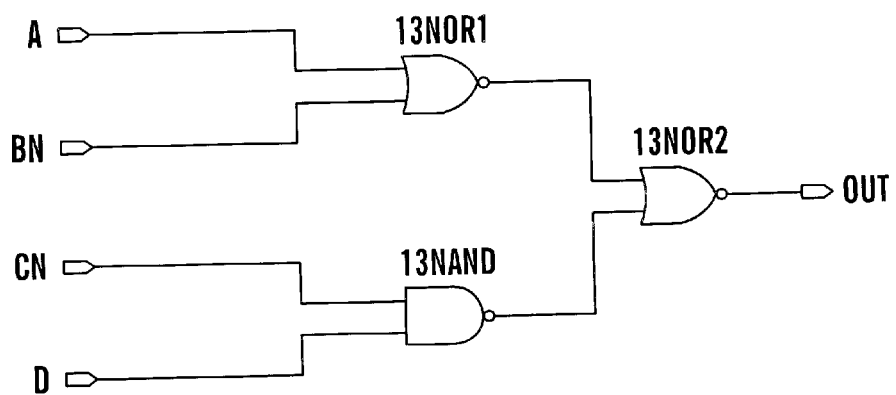
FIG. 6 is a block diagram of the combinational logic within cell 13 of the decoder of FIG. 3.
Figure 7:
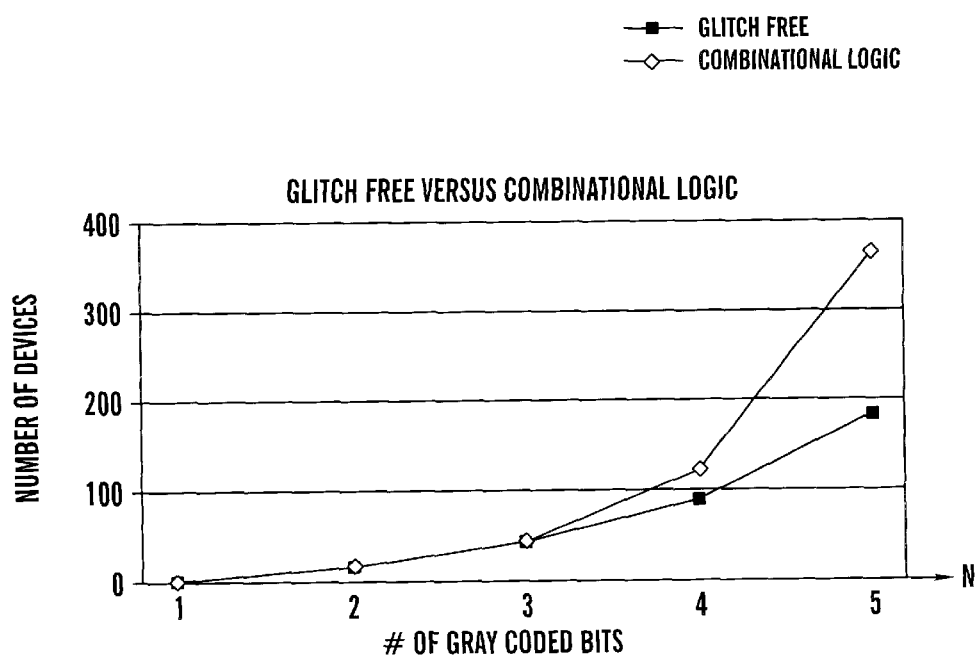
FIG. 7 is a graph depicting the relationship between the device counts for the disclosed AESD decoder and Combinational decoders for increasing numbers N of Gray coded bits.

Cells within decoders of the AESD topology are series cascaded generally with feedback from one cell provided to the previous cell, and with feedforward from one cell provided to the next cell. A given cell in the decoder's cascade of cells can be active only if all prior cells (or RSTN in the case of CELL_1) are active. This dependency corresponds to the sequential propagation of "active" bits in the sequential counts of Thermometer code depicted in FIG. 2.

The output of an active-low cell (e.g., CELL_3) can be directly connected as an input PRIORN (a feedforward) to the next adjacent active-high cell (e.g., CELL_4) and as an input NEXTN (a feedback) to the prior active-high cell (e.g., CELL_2). The output of an active-high cell (e.g., CELL_4) can be directly connected as an input PRIOR (a feedforward) to the next adjacent active-low cell (e.g., CELL_5) and as an input NEXT (a feedback) to the prior active-low cell (e.g., CELL_3). Active-low and active-high cells demonstrate complementary characteristics, and device-connection symmetry.

Active-low cells output a logic "0" voltage to activate the operatively coupled termination devices (see FIG. 11), and the same active-low output may be used for feedback and feedforward provided, respectively, to the active-high cells that immediately precede and follow the active-low cell. Active-high cells output a logic "1" voltage to activate the operatively coupled termination devices, and the same active-high output may be used for feedback and feedforward provided, respectively, to the active-low cells that immediately precede and follow the active-high cell.

Each of the BIT and BITN inputs (collectively referred to herein as BIT(N) inputs) of the plurality of cells represent a selected Gray code bit (e.g., A, B, C and D) or its complement (AN, BN, CN, and DN respectively). The term "gray code" as used herein includes any deterministic code or any segment of any code wherein only one bit changes between single-count incrementation or decrementations.

The Gray code bit (or its complement) selected to be input to each cell is that bit or complement that should "activate" the cell corresponding to the Thermometer code count (as shown in table 4a below). Because in Gray code only one Gray code bit will change during each increment or decrement (i.e., a single-count up or down) to a given count, the Gray code bit that changes is selected to "activate" the cell corresponding to the given count. Accordingly: The signal asserted at the BIT input of first cell (CELL_1) is that Gray code bit (A) which will change (become active) upon the first count (1) (e.g., Gray code bit A becomes a "1" at count 1 and CELL_1 inputs are active-high, thus the first cell "looks at" only Gray code bit A); the signal asserted at the BITN input of second cell (CELL_2) is the complement (BN) of that Gray code bit (B) which will change during the incrementation to the second count (e.g., Gray code bit B becomes a "1" at count 2 and CELL_2 inputs are active Low, thus the second cell "looks at" only the complement of Gray code bit B); the signal asserted at the BIT input of third cell (CELL_3) is the complement (AN) of the Gray code bit (A) which will change during the incrementation to the third count (e.g., Gray code bit A becomes a "0", and its complement AN becomes a "1" at count 3, thus the third cell "looks at" only the complement of Gray code bit A); the signal asserted at the BITN input of fourth cell (CELL_4) is the complement (CN) of the Gray code bit (C) which will change during the incrementation to the fourth count (e.g., BIT C becomes a "1", and its complement CN becomes a "0" at count 4. Because CELL_4 inputs are active Low, the fourth cell "looks at" only the complement of Gray code bit C); the signal asserted at the BIT input of fifth cell (CELL_5) is that Gray code bit (A) which will change (become "1") at count 5 (because CELL_5 inputs are active-high, the fifth cell "looks at" only Gray code bit A); etcetera.

Figure 8B:
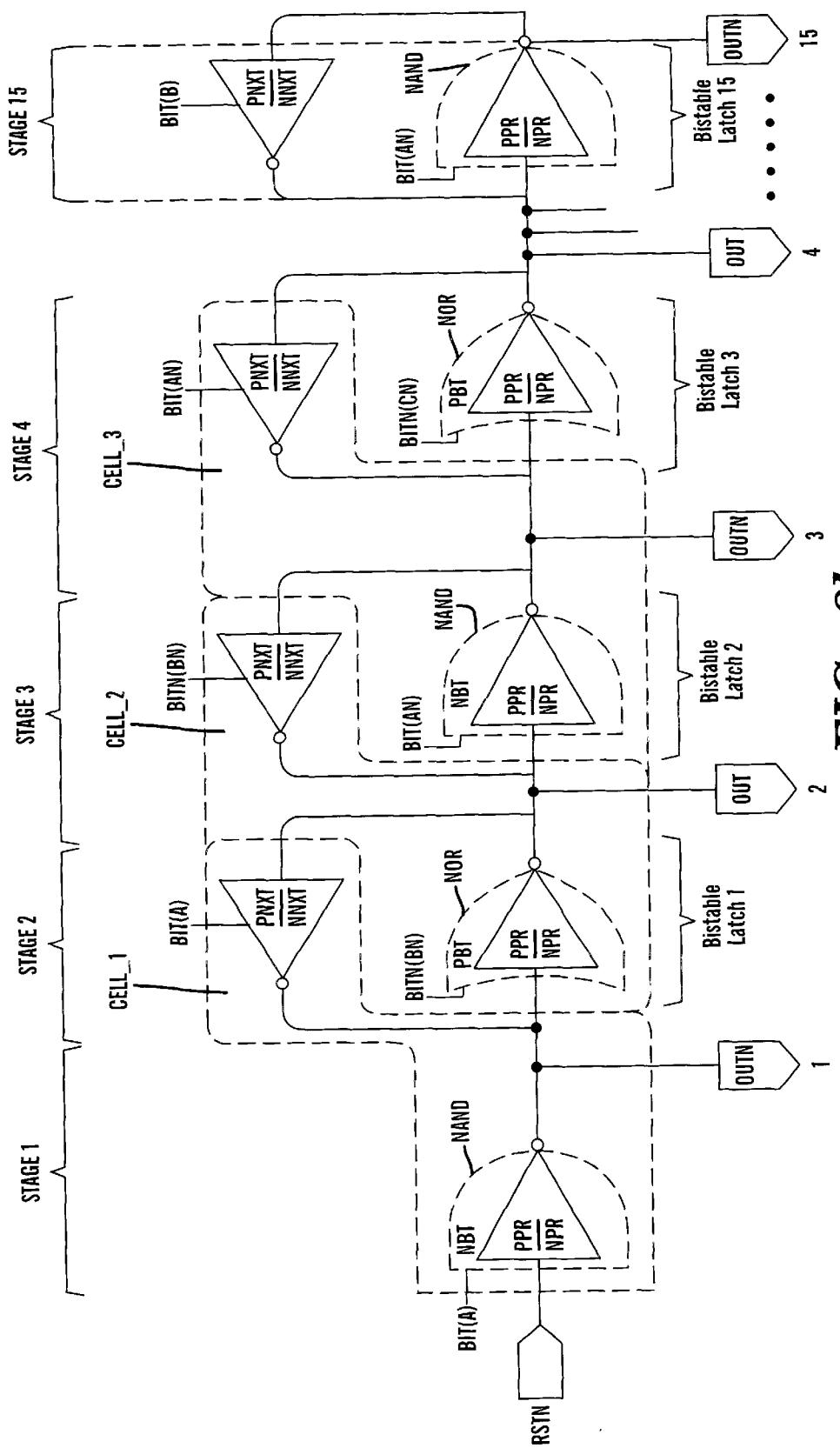
Figure 8C:
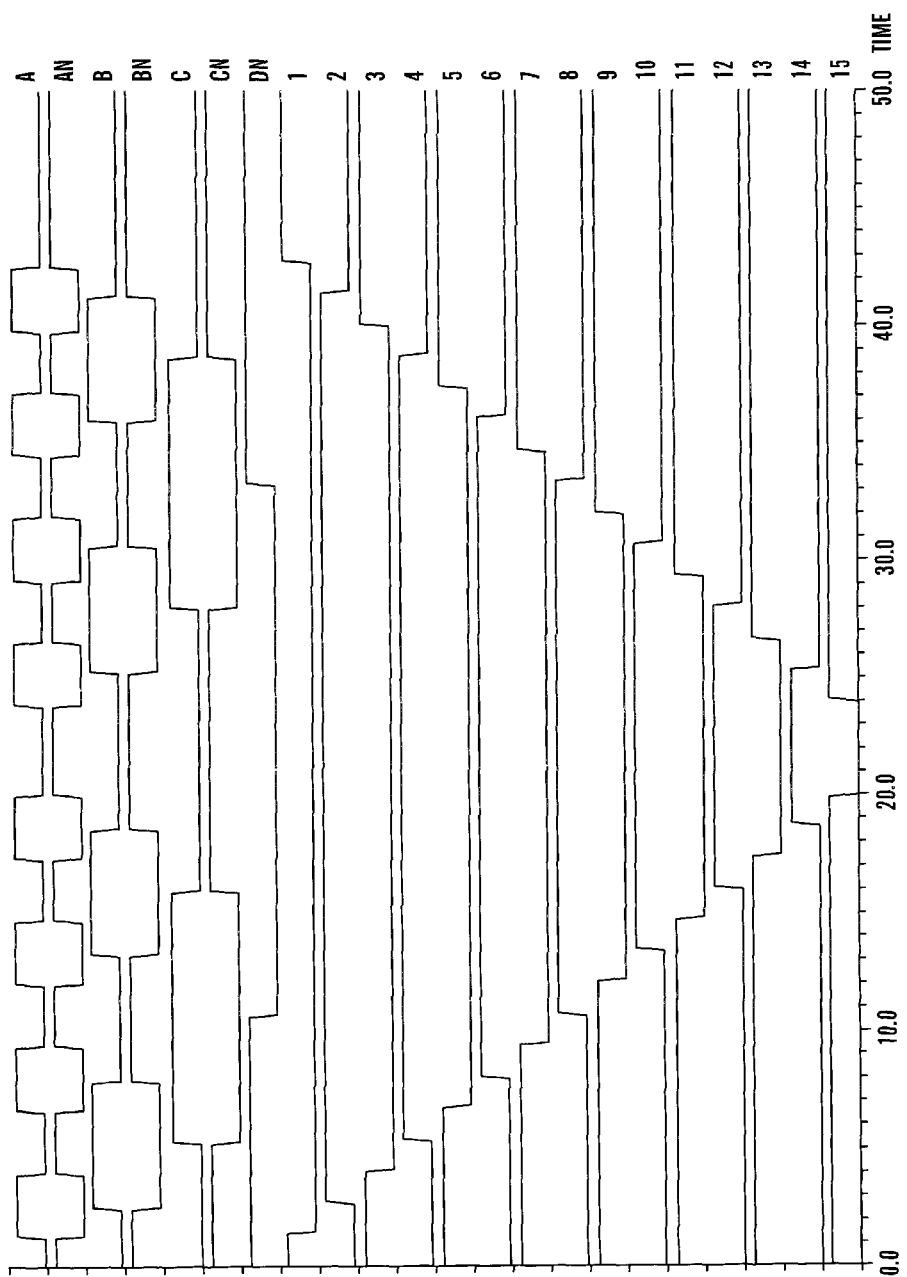

FIG. 8c is a timing diagram depicting waveforms of gray coded inputs and thermometer coded outputs of the sequential decoder of FIG. 8a.

Figure 9:
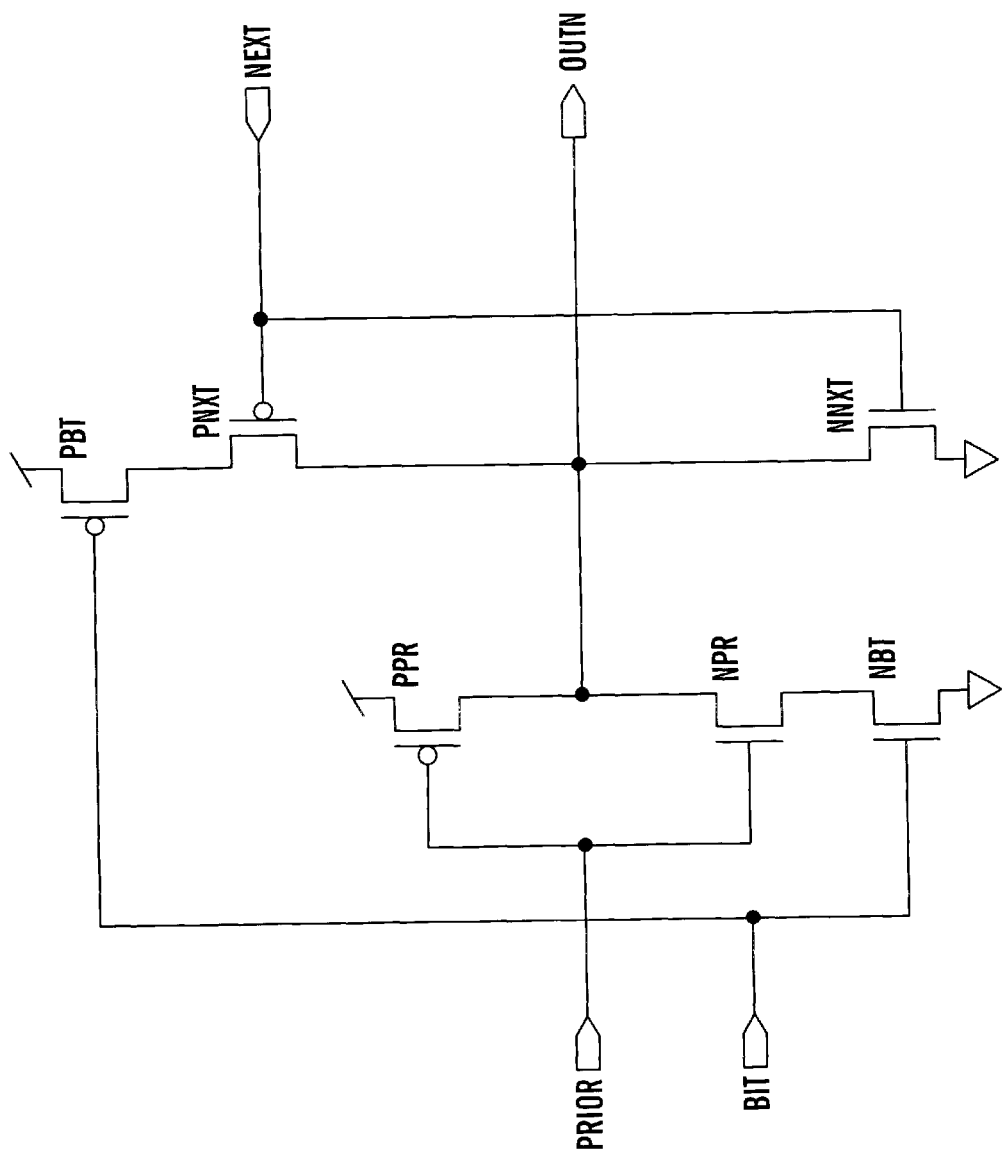

FIG. 9 depicts a circuit diagram of a generic active-low cell (e.g., CELL_3 of FIG. 8a) comprised of six switching devices (e.g., CMOS transistors NBT, PBT, NPR, PPR, NNXT and PNXT). The BIT input is externally connected to a selected Gray coded bit or bit-complement. In the case of a 4-Gray code bit decoder instance, the BIT input may be connected to bit A, B, C, D, or their complements. The specific Gray code bit connected to the BIT input depends upon the cell number as seen in FIG. 8a. The NEXT input is driven by the output (OUT) of the next active-high cell. The PRIOR input is driven by the output (OUT) of the prior active-high cell. Reciprocally, the OUTN output drives the NEXTN input of the prior cell and the PRIORN input of the next cell in the decoder's cascade of cells.

When PRIOR and BIT are high, OUTN is driven low (active). If the NEXT input subsequently goes high (indicating that the next cell is active), OUTN is held low (active) regardless of the state of the Gray code bit input BIT. In all other cases (e.g., the prior cell is active, and the next cell is inactive, but the BIT input is low), OUTN remains or is driven high (inactive). Table 2 (below) is a truth table for the active-low cells (e.g., odd numbered cells, e.g., CELL_1, CELL_3) in FIG. 8 and FIG. 9.

TABLE 2

Truth Table for an active-low Cell

| NEXT | PRIOR | BIT | OUTN |
|------|-------|-----|------|
| 0 | 0 | 0 | 1 |
| 0 | 0 | 1 | 1 |
| 0 | 1 | 1 | 0 |
| 0 | 1 | 0 | 1 |
| 1 | 1 | 0 | 0 |
| 1 | 1 | 1 | 0 |
| 1* | 0* | 1* | Don't care |
| 1* | 0* | 0* | Don't care |

*These specific input combinations do not exist in the Decoder operation since the preceding cell's output must be active-high (Prior = 1).

A special case exists for the first cell (CELL_1, FIG. 8a). Since there is no preceding cell, the PRIOR input is driven by a reset input RSTN. When RSTN goes low (upon initialization), it forces all of the succeeding cells into their inactive state. RSTN then must be held high until the next initialization. Persons skilled will recognize that the initializing property of the PRIOR input (and of the PRIORN input in the case of active-high cells) is supported by providing stronger devices (e.g., wider and/or shorter channel transistors) as PPR/NPR relative to weaker devices NNXT/PNXT (e.g., narrower and/or long channel transistors).

Figure 10:
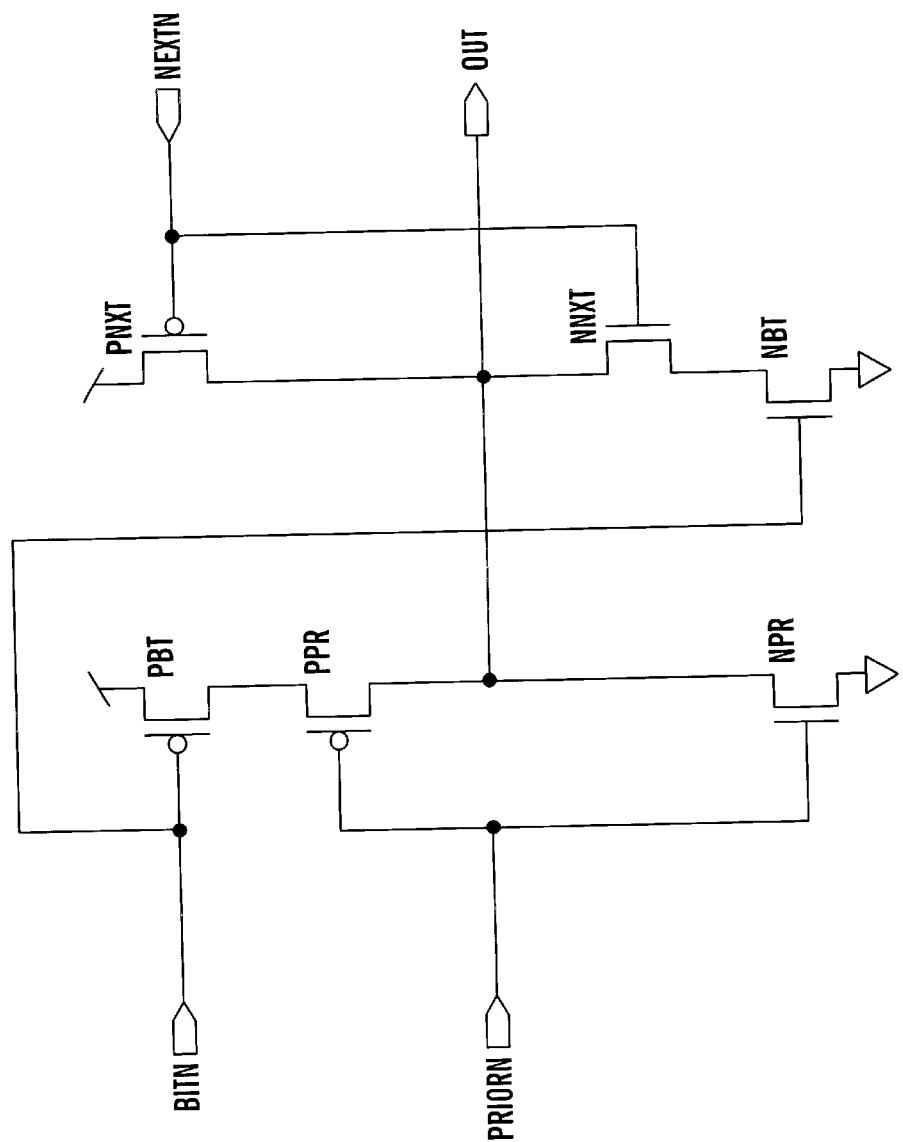

FIG. 10 depicts the active-high cell (e.g., CELL_4 of FIG. 8a) comprised of six switching devices (e.g., CMOS transistors NBT, PBT, NPR, PPR, NNXT and PNXT arranged differently than in the active-low cell of FIG. 9). As with the BIT input of active Low cells, the BITN input of active-high cells is connected to a Gray coded bit or its complement and the selection of which is dependent upon the specific cell, as seen in FIG. 8a. The NEXTN input is driven by the output (OUTN) of the succeeding (i.e., next) active-low cell. The PRIORN input is driven by the output (OUTN) of the preceding (i.e., prior) active-low cell. The OUT output drives the NEXT input of the preceding (active-high) cell and the PRIOR input of the succeeding (active-high) cell.

When PRIORN and BITN are low, OUT is driven high (active). If the NEXTN input (from the output OUTN of an active-low cell) subsequently goes low (indicating that the next cell is active), output OUT is kept high regardless of the state of the Gray code bit input BITN. In all other cases (e.g., the prior cell is active, and the next cell is inactive, but the BITN input is high), OUT remains or is driven Low (inactive). Table 3 (below) is a truth table for the active-high cells (e.g., even numbered cells, e.g., CELL_2, CELL_4) depicted in FIG. 8 and FIG. 10.

TABLE 3

Truth Table for an active-high Cell

| NEXTN | PRIORN | BITN | OUT |
|-------|--------|------|-----|
| 0 | 0 | 0 | 1 |
| 0 | 0 | 1 | 1 |
| 0* | 1* | 1* | Don't care |
| 0* | 1* | 0* | Don't care |
| 1 | 1 | 0 | 0 |
| 1 | 1 | 1 | 0 |

TABLE 3-continued

Truth Table for an active-high Cell

| NEXTN | PRIORN | BITN | OUT |
|---|---|---|---|
| 1 | 0 | 1 | 0 |
| 1 | 0 | 0 | 1 |

*These specific input combinations do not exist in the Decoder operation since the preceding cell's output must be active (PRIORN = 0) when the succeeding cell is active (NEXTN = 0).

The operation of the active-low cells (FIG. 9) and the active-high cells (FIG. 10) can both be understood by characterizing each cell as a combination of three interrupted inverters: a BIT signal inverter that inverts the BIT(N) signal is formed by PFET PBT stacked over NFET NBT; a feedforward signal inverter that inverts the PRIOR (N) signal from the output of the preceding cell is formed by PFET PPR stacked over NFET NPR; a feedback signal inverter that inverts the NEXT(N) signal from the output of the succeeding cell is formed by PFET PNXT stacked over NFET NNXT. Each of the three inverters is at least partially interruptable by one or more devices of another inverter in the cell. The BIT signal inverter is interruptable by devices controlled by both the PRIOR(N) input and the NEXT(N) input. Thus, the inverted BIT(N) input will only be asserted at the output OUT(N) of the cell when both the PRIOR(N) and NEXT(N) inputs do not inhibit its assertion. The BIT(N) signal is effectively gated by the PRIOR(N) signal by combination in a NAND-gate (active-low cells) or NOR-gate (active-high cells) formed of devices PPR, NPR, PBT and NBT. (See FIG. 8b) The BIT(N) signal is also effectively gated by the NEXT(N) in a combinatorial NOR-gate (active-low cells) or NAND-gate (active-high cells) formed of devices PBT, NBT, PNXT and NNXT. The PRIOR(N) input inhibits assertion of the inverted BIT(N) signal, while the NEXT(N) inhibits dis-activation of an active cell.

In alternative embodiments, the order in which devices of the same polarity are stacked upon each other may be rearranged (e.g. in FIG. 9, the position of PFET PBT may be swapped with the position of PFET PNXT). The inverter (PNXT over NNXT) that inverts the NEXT(N) signal is interrupted by a device (PBT in active-low cells, and NBT in active-high cells) of the BIT(N) signal inverter. Thus, (when the prior cell is active) the BIT(N) signal will interrupt the feedback inverter that inverts the NEXT(N) input, thereby asserting the inverted BIT(N) input as the output OUT(N) of the cell.

The Area Efficient Sequential Decoder (AESD) relies upon a specific BIT(N) input pattern to produce the desired Thermometer code output. The decoder can be initialized by driving the (PRIOR) input signal RSTN low. RSTN will then be then held high until re-initialization. Initialization places all of the outputs OUT and OUTN in their inactive state. After initialization, the Decoder is ready to receive Gray coded input. The input Gray code begins at 0000 and is incremented in steps of 1 until the desired Thermometer count value is reached.

Tables 4A and 4B display the sequential Gray code input and the resulting Thermometer code outputs. Table 4A is essentially the same as Table 1, except that the letter "A" (instead of "1") is used to denote the resulting "active" state of the Thermometer bits, and letter "x" is used to denote the "inactive" state of the Thermometer bits.

TABLE 4A

Gray code Input and Thermometer Code Output of an AESD during Sequential Incrementation (x = inactive, A = Active)

| Decimal Count | Gray Code DCBA | Thermometer Code 111111000000000 543210987654321 |
|---|---|---|
| 0 | 0000 | xxxxxxxxxxxxxxx |
| 1 | 0001 | xxxxxxxxxxxxxxA |
| 2 | 0011 | xxxxxxxxxxxxxAA |
| 3 | 0010 | xxxxxxxxxxxxAAA |
| 4 | 0110 | xxxxxxxxxxxAAAA |
| 5 | 0111 | xxxxxxxxxxAAAAA |
| 6 | 0101 | xxxxxxxxxAAAAAA |
| 7 | 0100 | xxxxxxxxAAAAAAA |
| 8 | 1100 | xxxxxxxAAAAAAAA |
| 9 | 1101 | xxxxxxAAAAAAAAA |
| 10 | 1111 | xxxxxAAAAAAAAAA |
| 11 | 1110 | xxxxAAAAAAAAAAA |
| 12 | 1010 | xxxAAAAAAAAAAAA |
| 13 | 1011 | xxAAAAAAAAAAAAA |
| 14 | 1001 | xAAAAAAAAAAAAAA |
| 15 | 1000 | AAAAAAAAAAAAAAA |

In this example, the Gray code input begins at 0000 and increments one bit at a time until it reaches a desired value of 1000, a Thermometer value of 15 (at which event, the outputs OUT (N) of all cells are active (i.e, active-high or active-low). To count down from any Gray code count, the Gray code is decremented 1 bit count at a time. If desired, the AESD Decoder can also be reset at any point and incrementation can begin again. As previously, noted, in the case of AESD decoders formed of a series of alternating active-low and active-high cells, the active outputs of each count will alternate from logic "0" to logic "1" voltages. At Thermometer code count 15, the voltage output of the active-low cells will be a logic low voltage level (i.e., "0"=active state), and the voltage output of the active-high cells will be a logic high voltage level (i.e., "1"=active state). Table 4B differs from Table 4A because Table 4B indicates actual voltage levels at the out put of each cell, and because odd numbered cell outputs of the AESD decoder are logic low in their active state. (In this particular example, Table 4B is illustrated to the decimal count of 12.)

TABLE 4B

Gray code Input to Thermometer Code Output during Sequential Incrementation. (L = Active Low; H = active-high)

| Decimal Count | Gray Code DCBA | Thermometer Code 111111000000000 543210987654321 LHLHLHLHLHLHLHL |
|---|---|---|
| 0 | 0000 | 101010101010101 |
| 1 | 0001 | 101010101010100 |
| 2 | 0011 | 101010101010110 |
| 3 | 0010 | 101010101010010 |
| 4 | 0110 | 101010101011010 |
| 5 | 0111 | 101010101001010 |
| 6 | 0101 | 101010101101010 |
| 7 | 0100 | 101010100101010 |
| 8 | 1100 | 101010110101010 |
| 9 | 1101 | 101010010101010 |
| 10 | 1111 | 101011010101010 |
| 11 | 1110 | 101001010101010 |
| 12 | 1010 | 100101010101010 |

Odd-numbered Thermometer code bits are active-low (0), and even-numbered Thermometer code bits are active-high (1). Boldface type indicates an Thermometer code bit corresponding to an ACTIVE device state.

Table 5 shows the incrementation process with respect to the inputs and outputs of the first 3 cells of any AESD decoder cascade in which the first cell is an active-low cell. The cells and the inputs and outputs of cells referred to in Tables 5 and 6 are depicted in FIG. 8a. The causal relationships due to the devices (transistors) between the inputs and outputs of cells are discussed below and illustrated by reference to the circuit diagrams depicting active-low and active-high cells provided in FIGS. 9 and 10 respectively. Upon initialization, the Gray code count will be set to zero.

ized (returned to the initialized state of thermometer code count zero) by decrementing the Gray code sequentially until Gray code count is zero.

After initialization, the output of all the cells will be inactive (e.g., the output of active-low cells will be high, and the output of active-high cells will be low.).

After the Gray code increments to 0001, the BIT input (A) will be high and the PRIOR input will be high. As a result, the output OUTN of CELL__1 (1) is driven low (active state). The low (active) output OUTN of CELL__1 drives the PRIORN input of CELL__2 low (active). The output OUT of CELL__2 remains low (inactive) since the BITN input (BN) of CELL__2 is still high.

TABLE 5

Cell Inputs and Outputs during Sequential Incrementation from Initialization to
Gray code Count of 0010 (=> means "goes to")

| Count # | INITIALIZE | 0 | 1 | 2 | 3 |
|---|---|---|---|---|---|
| Gray code DCBA | Resets to 0000 | 0000 | 0001 | 0011 | 0010 |
| CELL__1 PRIOR | 0 | =>1 | 1 | 1 | 1 |
| CELL__1 BIT (A) | =>0 | 0 | =>1 | 1 | 0 |
| CELL__1 NEXT | 0 | 0 | 0 | =>1 | 1 |
| CELL__1 OUTN (Active Low) | 1 Initializes to inactive state due to low PRIOR input | 1 Remains in inactive state due to low BIT (A) & NEXT inputs | =>0 Activates due to high BIT(A) & PRIOR inputs | 0 Stays active due to high NEXT, BIT(A), & PRIOR inputs | 0 Stays active due to high NEXT & PRIOR inputs |
| CELL__2 PRIORN | 1 | 1 | =>0 | 0 | 0 |
| CELL__2 BITN (BN) | =>1 | 1 | 1 | =>0 | 0 |
| CELL__2 NEXTN | 1 | 1 | 1 | 1 | =>0 |
| CELL__2 OUT (active-high) | 0 Initializes to inactive state due to high PRIORN input | 0 Remains in inactive state due to high PRIORN input | 0 Remains in inactive state due to high BITN(BN) & NEXTN inputs | =>1 Activates due to active (low) PRIORN & low BITN(BN) inputs | 1 Stays active due to active (low) PRIORN & NEXTN inputs |
| CELL__3 PRIOR | 0 | 0 | 0 | =>1 | 1 |
| CELL__3 BIT (AN) | =>1 | 1 | =>0 | 0 | =>1 |
| CELL__3 NEXT | 0 | 0 | 0 | 0 | 0 |
| CELL__3 OUTN (Active Low) | 1 Initializes to inactive state due to high PRIOR input | 1 Remains in inactive state due to low PRIOR input | 1 Remains in inactive state due to low PRIOR input | 1 Remains in inactive state due to low BIT(AN) and NEXT inputs | =>0 Activates due to high PRIOR and BIT inputs. |

The AESD decoder circuit is initialized by asserting an inactivating signal level to the PRIOR input of the first cell (RSTN shown connected to active-low CELL__1 in FIG. 8 is pulled low). (e.g., asserting a logic low voltage at the PRIOR input of the first cell in the case where the first cell is active-low, or asserting a logic high voltage at the PRIORN input of the first cell in an alternative embodiment, not shown, wherein the first cell is an active-high cell and the second cell is an active-low cell etc.) The inactivating signal asserted at the PRIOR input of the first cell will be effectively transmitted through each cell to the next cell in the AESD cascade until all the subsequent cells are in an their inactive state. This initialized state therefore corresponds to the count of zero in the Thermometer coded output, since no cells will have active outputs. The cells may also be initial- When the Gray code count increments to 0011, the BITN input of CELL__2 is driven low while the prior cell is active (PRIORN is low because output OUTN of active CELL__1 is low) and as a result the output OUT of CELL__2 (2) is driven high (active state). In turn, the output OUT of CELL__2 drives the NEXT input of CELL__1 high. Since the NEXT input of CELL__1 is high, the OUT of CELL__1 will remain low (active state) when the BIT input to CELL__1 subsequently goes low (e.g., when the count is incremented to 0010).

As the Gray code count increments to 0010, the BIT input to CELL__3 (AN) goes high. Since the PRIOR input of CELL__3 is high (indicating that CELL__2 is active), the output OUTN of CELL__3 (3) is driven low (active state). The input NEXTN of CELL__2 will be driven low by output OUTN of CELL_3. This keeps the output OUT of CELL_2 high (active state) if the BITN input to CELL_2 (BN) subsequently goes inactive-high as the count is incremented. In turn, the high NEXT input of CELL_1 maintains the output OUTN of CELL_1 low (active state) while the BIT input (A) of CELL_1 is low at Gray code count 3.

The subsequent cells of the AESD cascade would continue to operate in this manner as the Gray code count is sequentially incremented to the programmed final (i.e., desired) count. The NEXT and NEXTN inputs to the cells ensure that as long as a given cell is in its active state, all preceding cells will also be active. Conversely, the PRIOR and PRIORN inputs to the cells ensure that when a given cell is in its inactive state, all succeeding cells will also be inactive. The state of a given cell in the cascade which is at any time preceded by an active cell (i.e., the given cell's PRIOR(N) input is active) and followed by an inactive cell (i.e., the given cell's NEXT(N) input is inactive) is governed by the state of the BIT(N) input to that given cell.

Table 6 shows the decrementation process with respect to the inputs and outputs of the first 3 cells of any AESD decoder cascade in which the first cell is an active-low cell.

of CELL_2 is also driven high, but the output OUT of CELL_2 remains high (active state) since PRIORN and BITN of CELL_2 are low.

At the next decrementation down to 0001, the BITN input of CELL_2 (BN) goes high which drives the output OUT of CELL_2 low (inactive state). The output OUTN of CELL_1 remains low (active state) since PRIOR and BIT inputs of CELL_1 are high.

When the Gray code count reaches 0000, the BIT input to CELL_1 (A) is low and drives the output OUTN of CELL_1 high (inactive state).

FIG. 8b redepicts a portion of the sequential decoder of FIG. 8a, depicting the decoder 200 as a threshhold format sequential counter comprised of a plurality of bistable latches. The inverter of the PRIOR(N) input signal of a given cell, in combination with the inverter of the feedback input NEXT(N) of the preceding cell effectively form a bistable latch comprised of devices PPR and NPR of the given cell plus devices PNXT and NNXT of the preceding cell. A decoder cascade of order N (i.e., for decoding an N-bit Gray code word) will have up to M cells (where M is equal to or less than $2^N-1$) and will contain M−1 (or fewer with

TABLE 6

Cell Inputs and Outputs of AESD during Sequential decrementation from Gray code count of 0010 to 0000 (⇒ means "goes to")

| Count # | 3 | 2 | 1 | 0 |
|---|---|---|---|---|
| Gray code DCBA | 0010 | 0011 | 0001 | 0000 |
| CELL_1 PRIOR | 1 | 1 | 1 | 1 |
| CELL_1 BIT (A) | 0 | ⇒1 | 1 | ⇒0 |
| CELL_1 NEXT | 1 | 1 | ⇒0 | 0 |
| CELL_1 OUTN (Active Low) | 0 Remains active due to high NEXT & PRIOR inputs | 0 Remains active due to high NEXT & PRIOR inputs | 0 Remains active due to high PRIOR & BIT(A) inputs | ⇒1 Deactivates due to low BIT(A) and NEXT inputs |
| CELL_2 PRIORN | 0 | 0 | 0 | ⇒1 |
| CELL_2 BITN (BN) | 0 | 0 | ⇒1 | 1 |
| CELL_2 NEXTN | 0 | ⇒1 | 1 | 1 |
| CELL_2 OUT (active-high) | 1 Remains active due to low NEXTN & PRIORN inputs | 1 Remains active due to low PRIORN & BITN(BN) inputs | ⇒0 Deactivates due to high BITN(BN) & NEXTN inputs | 0 Remains inactive due to inactive (high) PRIORN input |
| CELL_3 PRIOR | 1 | 1 | ⇒0 | 0 |
| CELL_3 BIT (AN) | 1 | ⇒0 | 0 | ⇒1 |
| CELL_3 NEXT | 0 | 0 | 0 | 0 |
| CELL_3 OUTN (Active Low) | 0 Remains active due to high PRIOR and BIT(AN) inputs | ⇒1 Deactivates due to low BIT(AN) & NEXT inputs | 1 Remains inactive due to low PRIOR input | 1 Remains inactive due to low PRIOR input |

Table 6 shows the decrementation process performed when the Gray code count is decremented from 0010 to 0000. Initially, all three cell outputs (OUT(N) collectively) (1, 2 and 3) of CELL_1 through CELL_3 are in their active states, while the outputs OUT(N) (4–15) are in their inactive states.

When the count is decremented to 0011, the BIT input to CELL_3 (AN) goes low. As a result, the output OUTN of CELL_3 is driven high (inactive state). The NEXTN input optimizations discussed below) bistable latches. Each bistable latch performs the function of a memory device that stores information about the thermometer code count at the PRIOR(N) and OUT(N) nodes of the cell. During incrementation or decrementation of the count, the latched state of one cell is then logically combined with a BIT(N) input to the cell and the resulting new active/inactive state of the cell is stored in the latch and transmitted to the succeeding latch.

Each cell of the decoder cascade 200 constitutes a decoder circuit, for decoding a preselected single bit of the Gray code plus a forward driving portion of a first bistable latch circuit, plus a "keeper" portion of a second bistable latch circuit. The decoder 200 comprises a plurality of cascaded decoding-latching stages each responsive to an individual one of the single-bit changes (single-count incrementation or decrementation) between consecutive counts of a Gray code, for detecting and latching the occurrence of one such individual change, each of the plurality of decoding and latching circuits comprising a decoding-latching circuit (i.e., the decoding-latching circuit within the boundaries of each stage depicted in FIG. 8b). Because the most area-efficient embodiments of the invention employ alternating active-low and active-high decoding-latching circuits, the AESD decoder 200 is characterized by plurality of noninverted stages and inverted stages. In the decoder 200 of FIGS. 8a and 8b, the odd stages are deemed inverted stages, and the even stages are deemed noninverted stages. Inverted stages contain inverted (active-low) decoding-latching circuits. Noninverted stages contain noninverted (active-high) decoding-latching circuits. The inverted stages (e.g., stage 1, 3 . . . 15) have an active-low output OUTN. The noninverted stages (e.g., stages 2, 4 . . . 14) have an active-high output OUT.

The decoder 200 comprises one bistable latch for each noninverted and inverted stage except for the first stages. A bistable latch may also be omitted from the first stage to be influenced by the most significant bit MSB (e.g., Gray code bit D at stage/cell 8 in decoder 200 of FIG. 8a) of the Gray coded word to be decoded (see further examples of optimizations below near the end of detailed description).

Each of the M−1 or fewer bistable latches in the sequential decoder (e.g., 200) comprises two circuit branches, a first circuit branch comprising a first transistor (e.g., PPR of a given cell) and a second transistor (e.g., NPR of the given cell) serially connected between a supply voltage and ground, a second circuit branch comprising a third transistor (e.g., PNXT of a preceding cell) and a fourth transistor (e.g., NNXT of a preceding cell) serially connected between the supply voltage and ground, a first common node (e.g., the output OUT node of the given cell) between the first and second transistors being connected to control gate electrodes of the third and fourth transistors and forming an output OUT(N) of the latch, a second common node (e.g., the output OUT(N) node of the preceding cell) between the third and fourth transistors being connected to weakly control electrodes of the first and second transistors, a interconnection line connecting the first common node (i.e., the output signal OUT(N)) to any succeeding cell, (In some alternative embodiments, said third and fourth transistors may have turn-on voltages respectively differing, in absolute value, from the turn-on voltages of the first and second transistors.) The AESD may be characterized as comprising a cascading series of bistable latches each of which is controlled by two selected bits of the Gray code word to be decoded (or the complements of such Gray code bits). Because of the characteristics of the selected bits of the Gray code, the two selected bit inputs supplied to each bistable latch in the decoder 200 (e.g., BistableLatch1, BistableLatch2, or BistableLatch3) will be logically correlated to each other during single-count increments or decrements. As such, the two bits inputs (e.g., BIT(A) and BITN(BN)) controlling each bistable latch (e.g., BistableLatch1) effectively operate together as an increment/decrement control signal, which propagates an active/inactive threshold point forward (while incrementing) or backward (while decrementing). The threshold point is characterized by a linear series of outputs with all active states on one side of the threshold point and all inactive states on the opposite side of the threshold point. The threshold point can progress one cell at a time from a condition of all-inactive cells to a condition of all-active cells as the threshold point is advanced (during incrementation of the Gray code count). Conversely, the threshold point can recede one cell at a time to the condition of all-inactive cells as the threshold point is retreated (during decrementation of the Gray code count).

Figure 11:
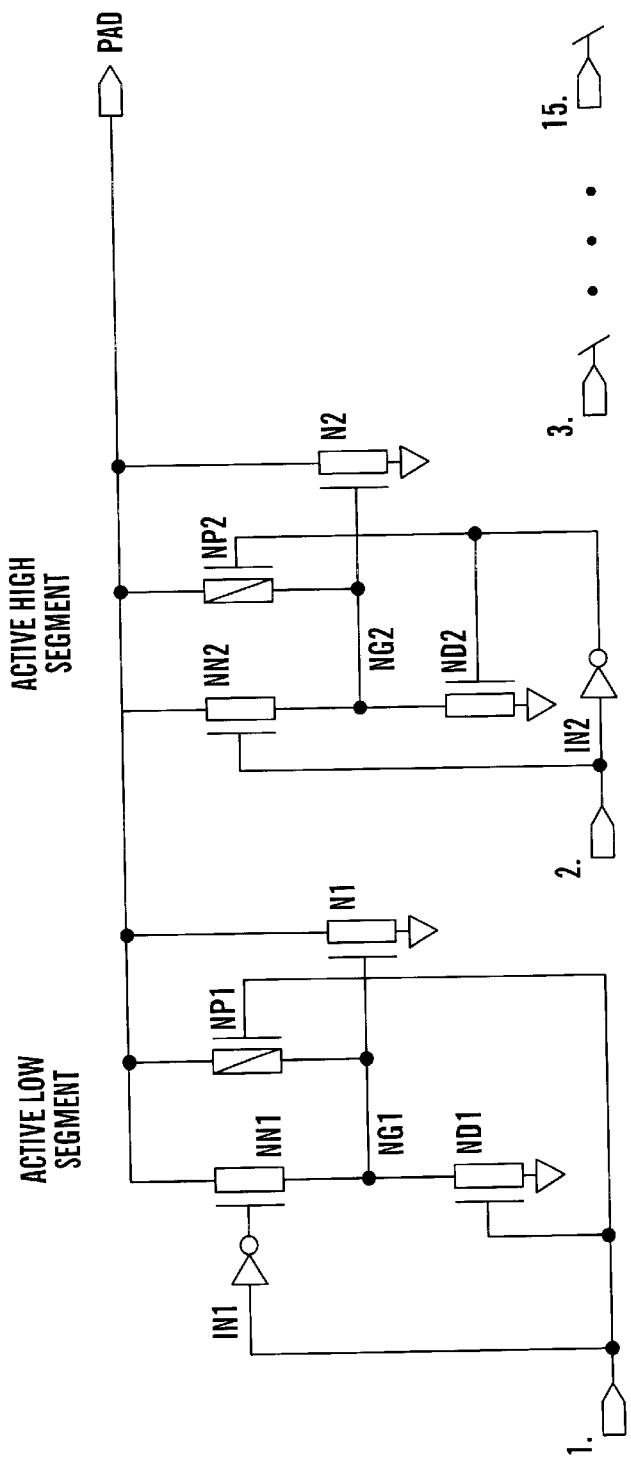

FIG. 11 shows a example of a pulldown termination circuit that may be driven by the outputs of the 4-bit Gray code to 15-bit Thermometer code Decoder depicted in FIG. 8a. FIG. 11 shows the first two segments of a 15-bit programmable pulldown termination circuit which may be located at each of a chip's input/ouput pads, which are representative of the remainder of the segments not shown. NFETs N1 and N2 together with NFETs N3–N15 (not shown) act as programmable pulldown resistors. Each of resistors N1 through N15 may be of equal resistance (thus giving equal weight to each bit of the Thermometer code), but each may instead be of a different resistance. By turning on the pulldown NFETs (N1–N15) via the Thermometer code count, a desired termination impedance can be set.

The gate to NFET pulldown N1 is connected to passgate devices NN1 and NP1 and to NFET ND1. At Thermometer count zero, NFET pulldown N1 is off when input (1) (decoder CELL_1's output (1)) is inactive-high which results in passgate devices NN1 and NP1 being turned off and NFET ND1 pulling node NG1 to GND. If the Thermometer code count is incremented to two, input (1) goes active (low) turning off NFET ND1 and turning on passgate devices NN1 and NP1 which connect the gate of NFET pulldown N1 to its drain (node PAD). If the Thermometer code count is further incremented to one, input (2) goes active (high) turning off NFET ND2 and turning on passgate devices NN2 and NP2 thus connecting the gate of NFET pulldown N2 to node PAD. By alternating the wiring connections, active-low and active-high terminator segments can be made to correspond with the alternating active-low and active-high decoder cell outputs thus keeping the device count minimized. Odd decoder cell outputs (1,3,5,7,9,11,13,15) may be connected to active-low terminator segments, and even decoder cell outputs (2,4,6, 8,10, 12,14) may be connected to active-high terminator segments.

The foregoing detailed description of embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. It will be apparent to those skilled in the art that area efficiencies can be further optimized in circuits employing the disclosed AESD in accordance with the following considerations.

At the maximum count "15" in the 4-bit Gray code to 15-bit Thermometer code Decoder depicted in FIG. 8, Gray code bit A goes low and the BIT input to cell_15 (AN) goes high resulting in Thermometer code bit 15 going active (low). The LAST cell in the decoder cascade (e.g., cell 15 in FIG. 8a) does not need feedback to its NEXT input from a non-existent next cell. Thus, the NEXT(N) input of the last cell in the cascade, and two devices (e.g., PNXT and NNXT) gated by the NEXT(N) input can be removed. In CEL_15, and the drain of PFET PBT is then connected directly to node OUTN. This type of device-count reduction can also be possible for the second-to-last cell in the decoder cascade. The Gray code BIT(N) input to the second to last cell remains active (keeps same state) at the last (maximum) count, therefore, the second to last cell doesn't need the NEXT(N) input nor the two devices gated by the NEXT(N) input. As a general matter, in the last cell in which a Gray code bit is changed (i.e., "looked at") in the decoder cascade, the NEXT(N) input and the two devices connected to the NEXT(N) input of that cell can be removed. The NEXT(N) input and devices connected to it are only needed to maintain the state of a cell if the cell's BIT(N) input can change states at subsequent higher counts.

A five device cell can also be used in placed of the six device cell the first time a Gray code bit is used in the decoder cascade. The first time a Gray code bit is used in the count, the PRIOR (N) device stacked in series with the BIT(N) device can be removed. For example, in the 4-bit Gray code to 15-bit Thermometer code Decoder, CELL_1 does not need device NPR. Cell_2 doesn't need device PPR. The stacked PRIOR(N) device is only needed to disable (interrupt) a cell's BIT input if the Gray code bit is previously used as an input to a cell at a lower count.

The cell driven by the most significant Gray code bit in the decoder cascade can be replaced by a wire or an inverter, or by a buffer activated by BIT(N) or its complement as appropriate. The most significant Gray code bit remains high for all higher counts. Therefore, no NEXT(N) devices are need in the cell driven by the most significant Gray code bit. Also, this is the first use of the most significant bit, so neither is PRIOR(N) circuitry needed.

In the 4-bit Gray code to 15-bit Thermometer code Decoder example (200 in FIG. 8), 15 devices can be omitted from the standard 90-device design. More particularly: one device from cell's 1, 2, 4 (the first time Gray code bits A, B, and C, respectively, are used); two devices from cell's 12, 14, 15 (the last time Gray code bits C, B, and A, respectively, are used); six devices from CELL_8 where the most significant Gray code bit is first used.

Figure 12:
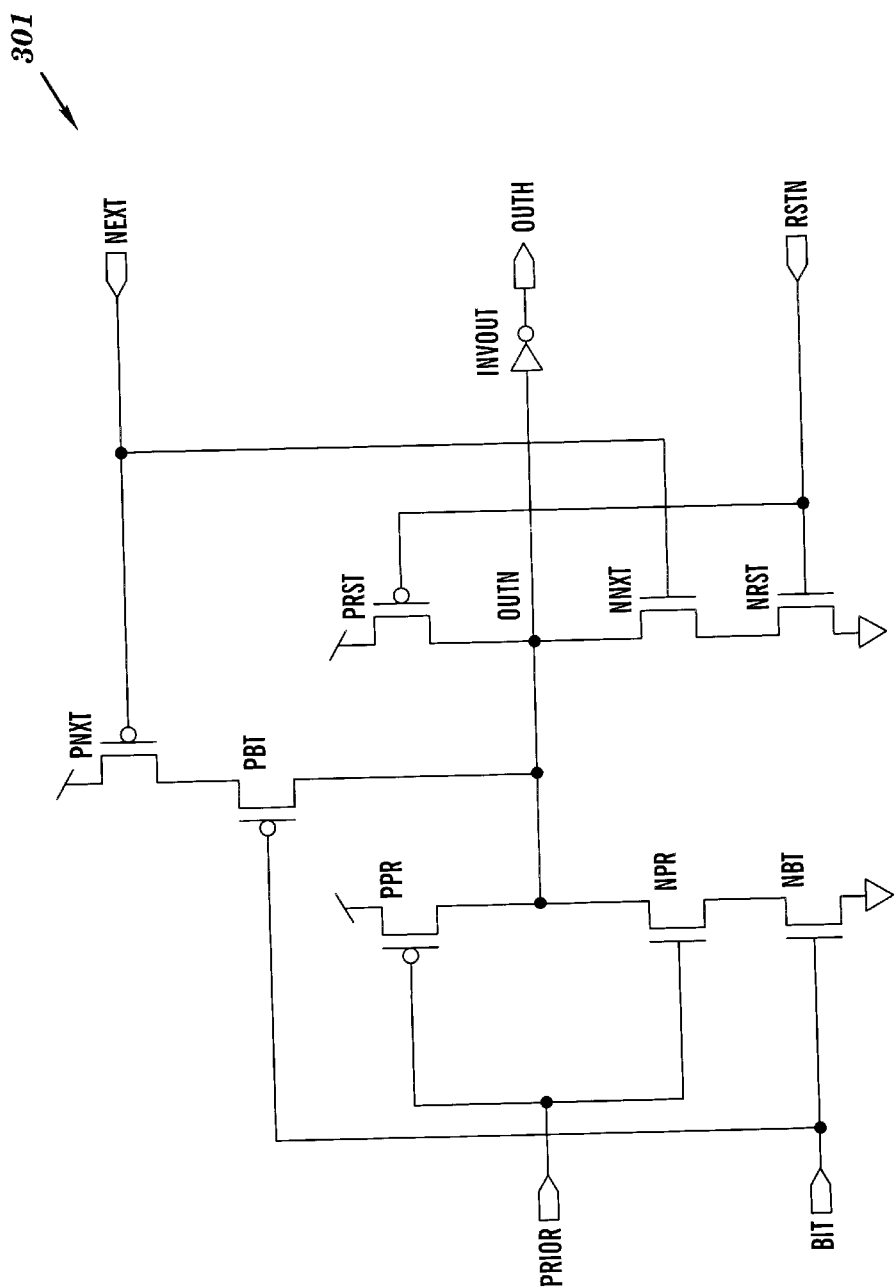
FIG. 12 is a schematic diagram of a generic self-cascading cell for constructing sequential decoders in accordance with embodiments of the invention.

FIG. 12 depicts an alternative embodiment of the invention, at the other end of the area efficiency spectrum, wherein a sequential decoder cascade may be implemented by cascading a plurality of copies of a self-cascading cell 301. The self-cascading cell is essentially the active-low cell of FIG. 9 plus an inverter INVOUT (connected to its existing active-low output OUTN) to make its new output OUTH active-high. (The active-high cell of FIG. 10 may also be readily adapted to form a self-cascading cell by the similar addition of an inverter to its existing active-high output OUT). The output OUTH of a given (e.g., second) self-cascading cell 301 in a cascade (not shown) may be directly connected to the NEXT input of a preceding (e.g., first) self-cascading cell, and to the PRIOR input of a succeeding (e.g., third) self-cascading cell. The BIT input of each of self-cascading cells 301 would be connected with a selection from the Gray code bits and their complements to form a sequential decoder (not shown) similar to the decoder 200 depicted in FIG. 8a. The self-cascading cell 301 may optionally include two dedicated reset devices (e.g., PFET PRST and NFET NRST) adapted to reset the cell. In some alternative embodiments, decoder cascades can be constructed by cascading a mixture of self-cascading cells (FIG. 12) and active-low cells (FIG. 9) and active high cells (FIG. 10).

It is intended that the following claims cover all such modifications and changes as fall within the true spirit and scope of the invention.

What is claimed is:

1. A circuit for decoding an N-bit gray coded count into a count of a unary code, comprising:
    a first cell having a first input and a first output;
    a second cell having a second input and a second output;
    a third cell having a third input and a third output,
        wherein the first output is gated by feedback from the second output, the second output is gated by feedforward from the first output and by feedback from the third output, and the third outputted is gated by feedforward from the second output,
        wherein the first, second and third inputs are each selected from gray code bits of the gray coded count and the logical complements of said gray code bits, and
        wherein the first, second and third outputs are each a different bit of the unary coded count or the logical complement of such a bit.

2. The circuit of claim 1, wherein N is at least 2.

3. The circuit of claim 1, wherein the unary code is Thermometer code.

4. An apparatus for decoding a consecutive sequence of N-bit Gray coded words, comprising: a sequential Gray code to Thermometer code decoder, having a plurality of cascaded decoding-latching stages each responsive to an individual one of single-bit changes between consecutive N-bit Gray coded words.

5. A Gray code decoder comprising: a plurality of cascaded decoding-latching stages, each decoding-latching stage responsive to an individual one of single-bit changes between consecutive counts in a Gray code, each decoding-latching stage adapted to detecting and latching the occurrence of one such single-bit change, each decoding and latching stage having a decoding-latching circuit.

6. The decoder of claim 5 wherein an output of each decoding-latching circuit of a first subset of the plurality of the decoding-latching circuits is an inverted Thermometer code bit, and wherein an output of each decoding-latching circuit of a second subset of the plurality of the decoding-latching circuits is a noninverted Thermometer code bit.

7. The decoder of claim 5, each of the decoding-latching circuits having inverted outputs serially alternating with decoding-latching circuits having noninverted outputs.

8. A circuit for decoding counts of an N-bit gray code to up to 2N−1 Thermometer coded bits, comprising: a plurality (u) of cells, each cell being adapted to output a single bit of the Thermometer coded bits, wherein an output of each of the u cells is influenced by an operative connection from an output of any next cell and is further influenced by an operative connection from an output of any prior cell.

9. An apparatus for converting gray code to thermometer code, the apparatus comprising: a plurality of modules, each module receiving one bit of the gray code and outputting a bit of the thermometer code, each module being coupled serially to another module.

10. A method for decoding an N-bit gray coded count into a count of a unary code, comprising:
    providing a circuit having a first cell, a second cell, and a third cell, the first cell having a first input and a first output, the second cell having a second input and a second output, the third cell having a third input and a third output;
    transmitting feedback from the second output to the first cell;
    transmitting feedforward from the first output to the second cell;

transmitting feedback from the third output to the second cell; and transmitting feedforward from the second output to the third cell, wherein the first output is gated by the feedback from the second output, the second output is gated by the feedforward from the first output and by the feedback from the third output, and the third output is gated by the feedforward from the second output, wherein the first, second and third inputs are each selected from gray code bits of the gray coded count and the logical complements of said gray code bits, wherein the first, second and third outputs are each a different bit of the unary coded count or the logical complement of such a bit.

11. The method of claim 10, wherein N is at least 2.

12. The method of claim 10, wherein the unary code is Thermometer code.

13. A method for decoding a consecutive sequence of N-bit Gray coded words, comprising: creating a plurality of cascaded decoding-latching stages, each stage responsive to an individual one of single-bit changes between consecutive N-bit Gray coded words.

14. A method of Gray code decoding, comprising:

providing a plurality of cascaded decoding-latching stages, each decoding-latching stage responsive to an individual one of single-bit changes between consecutive counts in a Gray code, each decoding and latching stage having a decoding-latching circuit; and detecting and latching, by each decoding-latching stage, the occurrence of each such single-bit change.

15. The method of claim 14, wherein an output of each decoding-latching circuit of a first subset of the plurality of the decoding-latching circuits is an inverted Thermometer code bit, and wherein an output of each decoding-latching circuit of a second subset of the plurality of the decoding-latching circuits is a noninverted Thermometer code bit.

16. The method of claim 14, each of the decoding-latching circuits having inverted outputs serially alternating with decoding-latching circuits having noninverted outputs.

17. A method for decoding counts of an N-bit gray code to up to u Thermometer coded bits, comprising:

providing a plurality (u) of cells, wherein u is an integer equal to or less than 2N−1; and outputting by each cell a single bit of the Thermometer coded bits, wherein the outputting by each said cell is influenced by an operative connection from an output of any next cell and is further influenced by an operative connection from an output of any prior cell.

18. A method for converting gray code to thermometer code, the method comprising:

providing a plurality of modules;

coupling each module serially to another module;

receiving by each module one bit of the gray code; and outputting by each module a bit of the thermometer code.

* * * * *